(12) United States Patent
Dandu et al.

(10) Patent No.: US 10,594,279 B2
(45) Date of Patent: Mar. 17, 2020

(54) COMBINING POWER AMPLIFIERS AT MILLIMETER WAVE FREQUENCIES

(71) Applicant: Texas Instruments Incorporated, Dallas, TX (US)

(72) Inventors: Krishnanshu Dandu, Allen, TX (US); Brian Paul Ginsburg, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/370,087

(22) Filed: Mar. 29, 2019

(65) Prior Publication Data
US 2019/0229425 A1    Jul. 25, 2019

Related U.S. Application Data

(63) Continuation of application No. 15/256,421, filed on Sep. 2, 2016, now Pat. No. 10,291,193.

(51) Int. Cl.
| | |
|---|---|
| *H03F 3/68* | (2006.01) |
| *H03F 3/24* | (2006.01) |
| *H03G 3/30* | (2006.01) |
| *G01S 7/03* | (2006.01) |
| *G01S 13/931* | (2020.01) |

(Continued)

(52) U.S. Cl.
CPC .............. *H03F 3/68* (2013.01); *G01S 7/032* (2013.01); *G01S 13/931* (2013.01); *H01Q 1/3233* (2013.01); *H01Q 21/08* (2013.01); *H03F 3/195* (2013.01); *H03F 3/211* (2013.01); *H03F 3/245* (2013.01); *H03F 3/45475* (2013.01); *H03G 3/3042* (2013.01); *H01Q 9/065* (2013.01); *H03F 2200/294* (2013.01); *H03F 2200/451* (2013.01);

(Continued)

(58) Field of Classification Search
CPC .......... H01Q 9/065; H01Q 1/48; H03F 1/565; H03F 3/19; H03F 3/245; H03F 3/3042; H03F 2200/294; H03F 2200/435; H03F 2200/451; H03F 3/68; H04B 2001/0408; H03H 7/487
USPC ......................................................... 333/124
See application file for complete search history.

(56) References Cited

U.S. PATENT DOCUMENTS

| | | |
|---|---|---|
| 8,536,948 B2 | 9/2013 | Kawai |
| 2016/0006400 A1 | 1/2016 | Mu |
| 2019/0238106 A1* | 8/2019 | Mohta ...................... H03F 3/21 |

OTHER PUBLICATIONS

"Comparing Microstrip and Grounded Coplanar Waveguide", published in Microwave Journal on May 12, 2015 (Year: 2015).*

(Continued)

*Primary Examiner* — Benny T Lee
*Assistant Examiner* — Hafizur Rahman
(74) *Attorney, Agent, or Firm* — Michelle F. Murray; Charles A. Brill; Frank D. Cimino

(57) ABSTRACT

A system having a set of power amplifiers each having a primary inductive structure configured to provide an output signal. A secondary inductive structure is configured to inductively couple to each of the primary inductive structures. A transmission line is provided with a signal trace and a ground trace. The signal trace of the transmission line is connected to a first end of the secondary inductive structure. A return path from a second end of the secondary inductive structure is coupled via a resonant network to the ground trace of the transmission line, in which the return path is spaced away from the secondary inductive structure to minimize inductive coupling to the primary structures.

19 Claims, 7 Drawing Sheets

(51) Int. Cl.

| | |
|---|---|
| *H01Q 1/32* | (2006.01) |
| *H01Q 21/08* | (2006.01) |
| *H03F 3/195* | (2006.01) |
| *H03F 3/21* | (2006.01) |
| *H03F 3/45* | (2006.01) |
| *H01Q 9/06* | (2006.01) |
| *H03H 7/48* | (2006.01) |
| *H04B 1/04* | (2006.01) |

(52) U.S. Cl.
CPC ..... *H03H 7/487* (2013.01); *H04B 2001/0408* (2013.01)

(56) References Cited

OTHER PUBLICATIONS

Pattnayak et al., "Antenna Design and RF Layout Guidelines", application note AN91445 of Cypress Semiconductor Corporation, 2014-2018, Document No. 001-91445 Rev. *H (Year: 2018).*

Tutorial 5100 of Maxim Integrated, by Michael Bailey entitled, "General Layout Guidelines for RF and Mixed-Signal PCBs" published on Sep 14, 2011 (Year: 2011).*

Dixian Zhao and Patrick Reyneart, "A 0.V 20.9dBm 22.3%-PAE E-Band Power Amplifier with Broadband Parallel-Series Power Combiner in 40nm CMOS", 2014 IEEE International Solid-State Circuits Conference (ISSCC), Feb. 9-13, 2014, Session 14, San Francisco, CA, pp. 248-250.

Jie-Wei Lai and Alberto Valdes-Garcia, "A 1V 17.9dBm 60gHz Power Amplifier in Standard 65nm CMOS", 2010 IEEE International Solid-State Circuits Conference (ISSCC), Feb. 7-11, 2010, Session 23, San Francisco, CA, pp. 424-426.

"Advanced Driver Assistance (ADAS) Solutions Guide", Texas Instruments, Inc., SLYY044A, 2015, pp. 1-33.

* cited by examiner

COMBINING POWER AMPLIFIERS AT MILLIMETER WAVE FREQUENCIES

This application is a continuation of U.S. patent application Ser. No. 15/256,421, filed Sep. 2, 2016, currently pending, which is hereby incorporated by reference herein in its entirety.

FIELD OF THE INVENTION

This disclosure relates to power amplifiers operating in the millimeter (mm) wave frequency spectrum, and more particularly to combining outputs from several power amplifiers to increase signal strength.

BACKGROUND OF THE INVENTION

A new class of safety systems, referred to as advanced driver assistance systems (ADAS), has been introduced into automobiles to reduce human operation error. These systems are enabled by smart sensors based primarily on millimeter-wave automotive radars. The proliferation of such assistance systems, which may provide functionality such as rear-view facing cameras, electronic stability control, and vision-based pedestrian detection systems, has been enabled in part by improvements in microcontroller and sensor technologies. Enhanced embedded radar-based solutions are enabling complementary safety features for ADAS designers.

In an automotive radar system, one or more radar sensors may be used to detect obstacles around the vehicle and the speeds of the detected objects relative to the vehicle. A processing unit in the radar system may determine the appropriate action needed, e.g., to avoid a collision or to reduce collateral damage, based on signals generated by the radar sensors. Current automotive radar systems are capable of detecting objects and obstacles around a vehicle, the position of any detected objects and obstacles relative to the vehicle, and the speed of any detected objects and obstacles relative to the vehicle. Via the processing unit, the radar system may, for example, alert the vehicle driver about potential danger, prevent a collision by controlling the vehicle in a dangerous situation, take over partial control of the vehicle, or assist the driver with parking the vehicle.

An integrated circuit (IC) containing a radar transceiver may be placed at each location in a vehicle where a radar signal is needed. For example, three ICs may be located on the front of a vehicle (middle and both corners) to provide forward looking coverage. Additional ICs may be deployed on the sides and rear of the vehicle.

BRIEF DESCRIPTION OF THE DRAWINGS

Particular embodiments in accordance with the invention will now be described, by way of example only, and with reference to the accompanying drawings.

Figure 1:
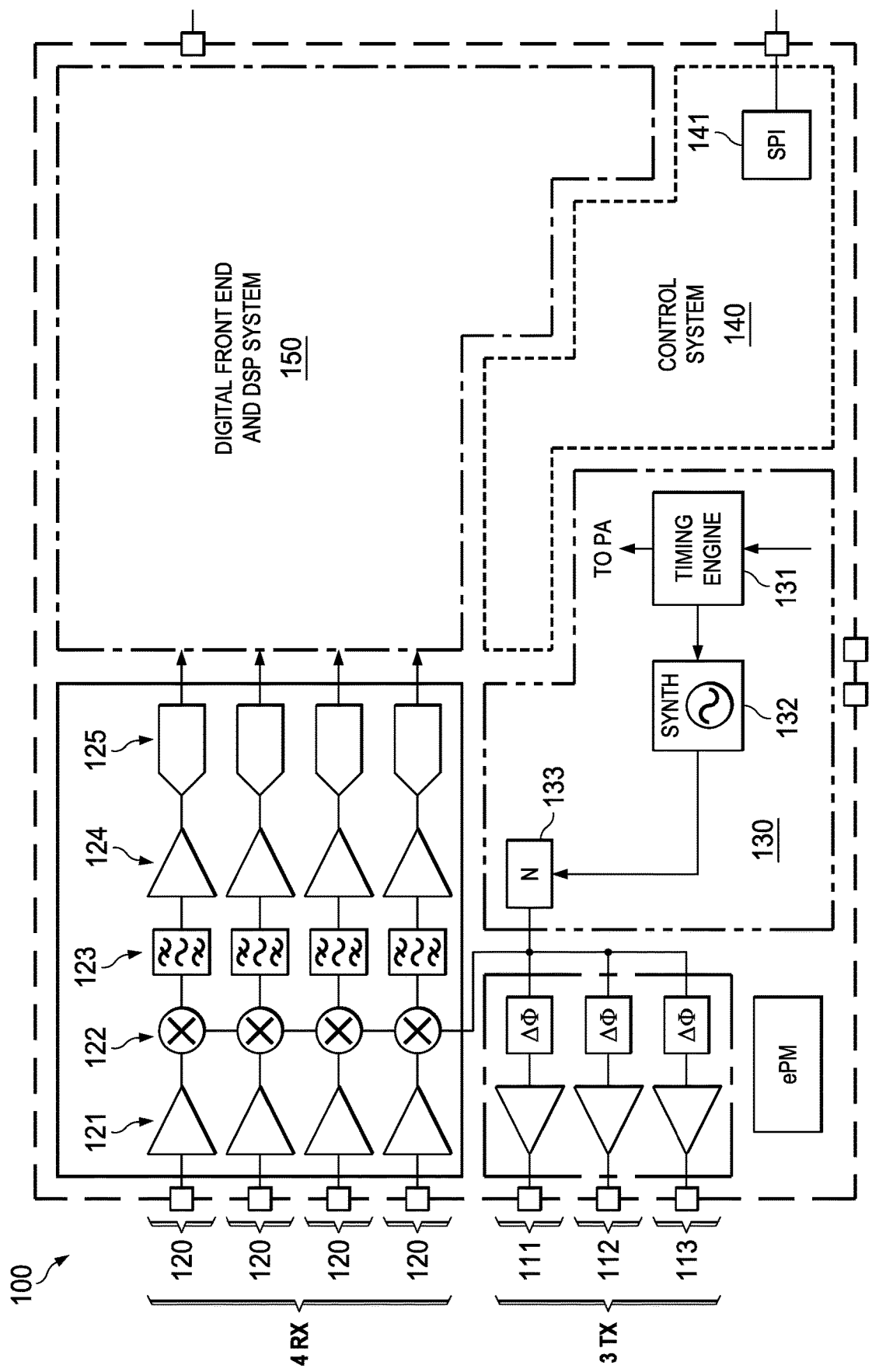
FIG. 1 is a block diagram of an exemplary radar system on a chip (SoC) that may include multiple radar transmitters and receivers.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Highly integrated solutions are preferred for automotive radar applications, and CMOS (Complementary Metal Oxide Semiconductor) technology is a candidate for mm-Wave SoC (system on chip) products. For example, automotive radar systems currently may operate in the 76-81 GHz band. To provide good radar performance, the TX (transmit) power requirement may be high. To deliver such a power level at 80 GHz using CMOS is challenging. To attain fT/fMAX (max unity current gain cut-off frequency/max oscillation frequency) for providing sufficient gain at 80 GHz, deeply-scaled CMOS technology may be used, which comes with low drain-source voltage for reliable operation. Therefore, to design a power amplifier (PA) with enhanced power capability, increased current and device size may be needed. A transformer-based power-combining technique may be used since it allows building a distributed amplifying structure of large size with reduced parasitic effects for high frequencies.

There are currently several examples of transformer based combined power amplifiers; see, for example, "A 0.9V 20.9 dBm 22.3%-PAE E-band Power Amplifier with Broadband Parallel-Series Power Combiner in 40 nm CMOS," Dixian Zhao and Patrick Reyneart, ISSCC 2014. In this example, a parallel section of the combiner is implemented using a Wilkinson combiner and hence requires significant area for implementation. Also, the feed network construction is linear, leading to a long chain in one dimension.

Another example is described in "A 1V 17.9 dBm 60 GHz Power Amplifier in Standard 65 nm CMOS," Jie-Wei Lai and Alberto Valdes-Garcia, ISSCC 2010. In this example, a differential output on secondary side of combiner requires an additional balun to drive a single ended antenna. Output is taken out between the stages driving the combiner which may lead to imbalances between the left and right halves as well as potential issues with routing power and ground to the stages.

An improved topology will now be disclosed that provides efficient and compact power combining at millimeter wave frequencies. The power combiner disclosed herein achieves a low loss multi-way power combiner by using slab-style coupled line structures as series and parallel coupled transformers, while providing a resonant return path for currents in the secondary of the transformer.

The solution disclosed herein uses a resonant termination on the secondary winding of the combiner that may form a single ended output, whereas prior solutions have terminated the secondary return to ground.

This solution disclosed herein allows for a linear arrangement of series combined amplifier elements around the secondary winding. Parallel elements may be placed along the horizontal axis of symmetry of the secondary winding.

The layout of a series parallel combiner as disclosed herein allows a very compact and symmetric implementation of the driving amplifiers around the horizontal axis. Using a resonant effect, secondary inductance may be tailored to get an optimal impedance transformation from the driving amplifiers to the antenna. As will be described in more detail below, RF current in the secondary is returned back to the transmission line ground via a well-defined return path.

FIG. 1 is a block diagram of an exemplary radar system on a chip (SoC) 100 that may include multiple radar transmitters and receivers within a single integrated circuit package. Radar SoC 100 may include multiple transmit channels 111-113 for transmitting FMCW (frequency modulated continuous wave) RF signals and multiple receive channels 120 for receiving the reflected transmitted signals. Further, the number of receive channels may be larger than the number of transmit channels. For example, an embodiment of the radar SoC 100 may have three transmit channels and four receive channels. Other radar SoC embodiments may have more or fewer transmit and receive channels, for example. In some embodiments, one SoC may include a set of receivers and another SoC may include a set of transmitters, for example. The general operation of ADAS systems is now well known and need not be described in detail herein; see, e.g., "Advanced Driver Assistance (ADAS) Solutions Guide," 2015, available from Texas Instruments Incorporated.

A transmit channel may include a suitable transmitter and antenna. A receive channel includes a suitable receiver and antenna. Further, each of the receive channels 120 may be identical and include a low-noise amplifier (LNA) 121 with one or more stages to amplify the received signal, a mixer 122 to mix the signal generated by the transmission generation circuitry with the received signal to generate an IF signal, a baseband band pass filter 123 for filtering the IF signal, a variable gain amplifier (VGA) 124 for amplifying the filtered IF signal, and an analog-to-digital converter (ADC) 125 for converting the analog IF signal to a digital IF signal. The mixer serves as a down converter that generates an output signal with a frequency equal to the difference between the frequency of the inputs received from the low-noise amplifier and the transmission generation circuitry, both of which are radio frequency (RF) signals. The band pass filter, VGA, and ADC of a receive channel may be collectively referred to as a baseband chain or baseband filter chain. Further, the bandpass filter and VGA may be collectively referred to as an IF amplifier (IFA).

The receive channels 120 may be coupled to a digital front end (DFE) and Digital Signal Processor (DSP) system module 150. The DFE and DSP system module may also be coupled to the control (CNTL) module 140 to complete the function of the radar module in both functional and test modes and external data communication.

A serial peripheral interface (SPI) 141 may provide an interface for communication with the processing unit located in another IC. For example, the processing unit may use the SPI 141 to send control information, e.g., timing and frequencies of chirps, output power level, triggering of monitoring functions, etc., to the DFE and DSP System module 150. The radar SoC 100 may use the SPI 141, for example, to send test data to the processing unit.

The control module 140 and DFE and DSP System module 150 may include functionality to control the operation of the radar SoC 100 in normal mode and in test mode.

A 10 GHz or higher frequency modulation synthesizer (FM-Synth) module 130 generates the RF signals that may then be multiplied by four (for example) and provided to the transmitter channels. The programmable timing engine 131 includes functionality to receive chirp parameter values for a sequence of chirps in a radar frame from the control module 140 and to generate chirp control signals that control the transmission and reception of the chirps in a frame based on the parameter values. The chirp parameters may be defined by the radar system architecture and may include, for example, a transmitter enable parameter for indicating which transmitters to enable, a chirp frequency start value, a chirp frequency slope, a chirp duration, indicators of when the transmit channels should transmit and when the DFE output digital should be collected for further radar processing, etc. One or more of these parameters may be programmable.

The radio frequency synthesizer (SYNTH) 132 includes functionality to generate FMCW (frequency modulated continuous wave) signals for transmission based on chirp control signals from the timing engine 131. In some embodiments, the SYNTH 132 may include a phase locked loop (PLL) with a voltage controlled oscillator (XO).

The clock multiplier 133 increases the frequency of the transmission signal (LO signal) to the LO frequency of the mixers 122. A clean-up PLL (phase locked loop) operates to increase the frequency of the signal of an external low frequency reference clock (not shown) to the frequency of the SYNTH 132 and to filter the reference clock phase noise out of the clock signal.

The clock multiplier 133, synthesizer 132, timing generator 131, and clean up PLL are an example of transmission generation circuitry. The transmission generation circuitry generates a radio frequency (RF) signal as input to the transmit channels and as input to the mixers in the receive channels via the clock multiplier. The output of the transmission generation circuitry may be referred to as the LO (local oscillator) signal or the FMCW signal.

The circuitry 140 may include one or more temperature sensors and various RF/analog measurement components.

Figure 2:
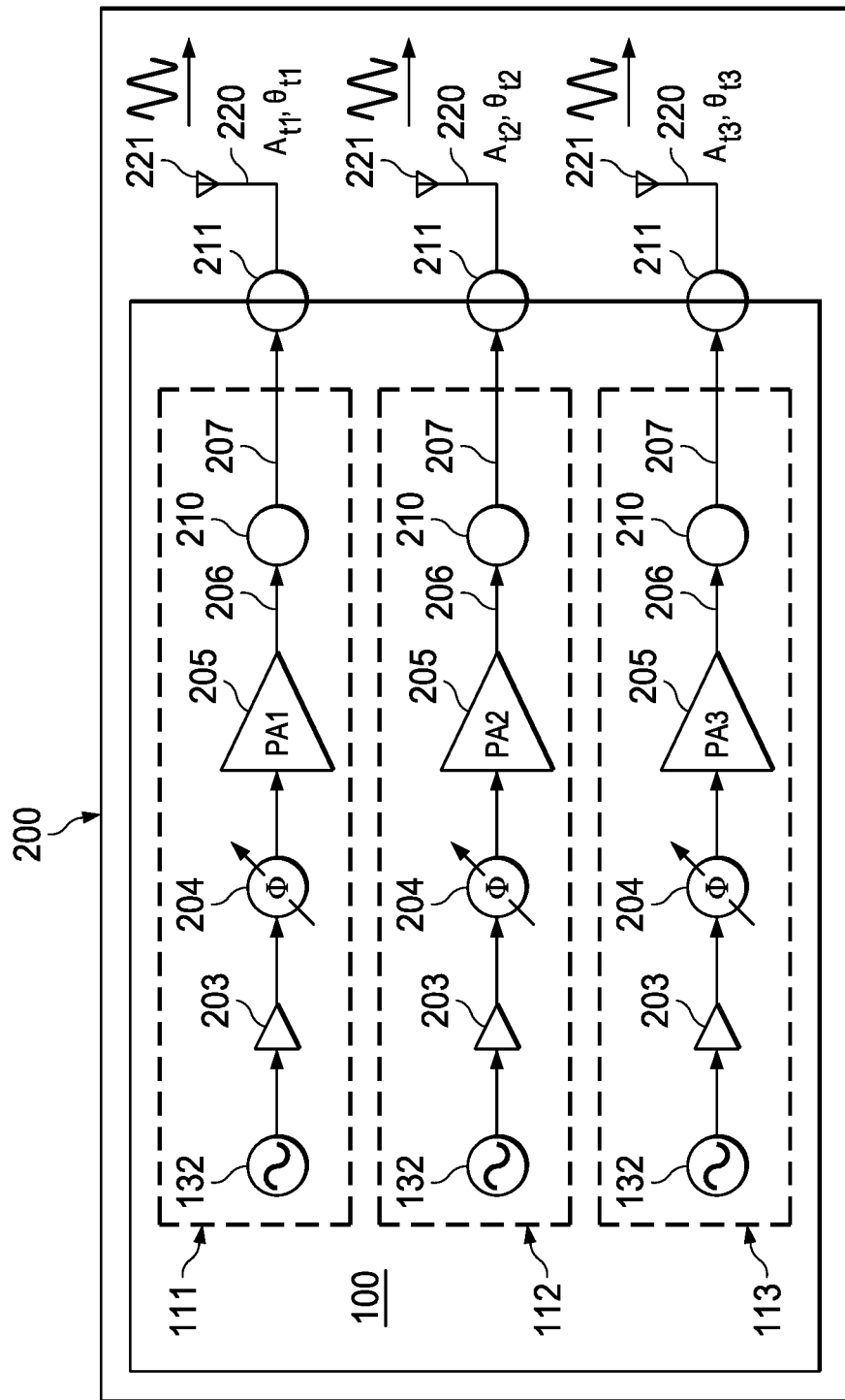
FIG. 2 is a more detailed block diagram of the transmit channels of the system of FIG. 1.

FIG. 2 is a more detailed block diagram of the transmit channels 111-113 of system 100 of FIG. 1. In this example, SoC 100 is mounted on a substrate 200 which may be any type of known or later developed substrate suitable for supporting one or more ICs. For example, substrate 200 may be a multilayer printed circuit board, quartz, or glass with one or more conductive layers applied to a surface, etc.

In this example, each of the transmit channels 111-113 are similar and each transmit channel may incorporate a prepower amplifier (PPA) 203 coupled to synthesizer 132 to receive the FMCW signal, a programmable phase shifter 204 coupled to the PPA 203 to receive the amplified signal, and a power amplifier (PA) 205 coupled to the phase shifter 204 to receive the shifted signal. In some embodiments, the shifter 204 may be programmed for both frequency and phase shifting. That is, the output signal of a shifter 204 may have a frequency equal to the input frequency plus a programmable offset frequency and a phase equal to the input phase plus a programmable offset phase, for example.

In this example, a transmission line 206 routes the output of PA 205 to a die bump 210 located on SoC 100. A transmission line 207 then routes the output of PA 205 to a ball bond 211 on the outside of the package that encapsulates SoC 100 and provides a connection to substrate 200, using known or later developed semiconductor packaging technology. Transmission line 220 then routes the output of PA 205 to an antenna 221 that is formed on substrate 200. Each transmission line segment 207, 208, and 220 is designed to produce a selected impedance at the operating frequency of transmit channel 110 using known or later developed design techniques. In this example, each transmission line segment is designed to have an impedance of approximately 50 ohms at 77-80 GHz.

In this example, the various antennas such as antenna 221 may be formed on substrate 200 using known or later developed processing technologies. For example, the antennas may be formed by etching a pattern for the antenna in a conductive layer within or on a surface of substrate 200. In another example, a 3-dimensional (3D) structure such as a horn antenna may be fabricated as a separate structure and mounted on substrate 200. In another example, a 3D antenna structure may be formed using an additive technique such as 3D printing, for example.

Figure 3:
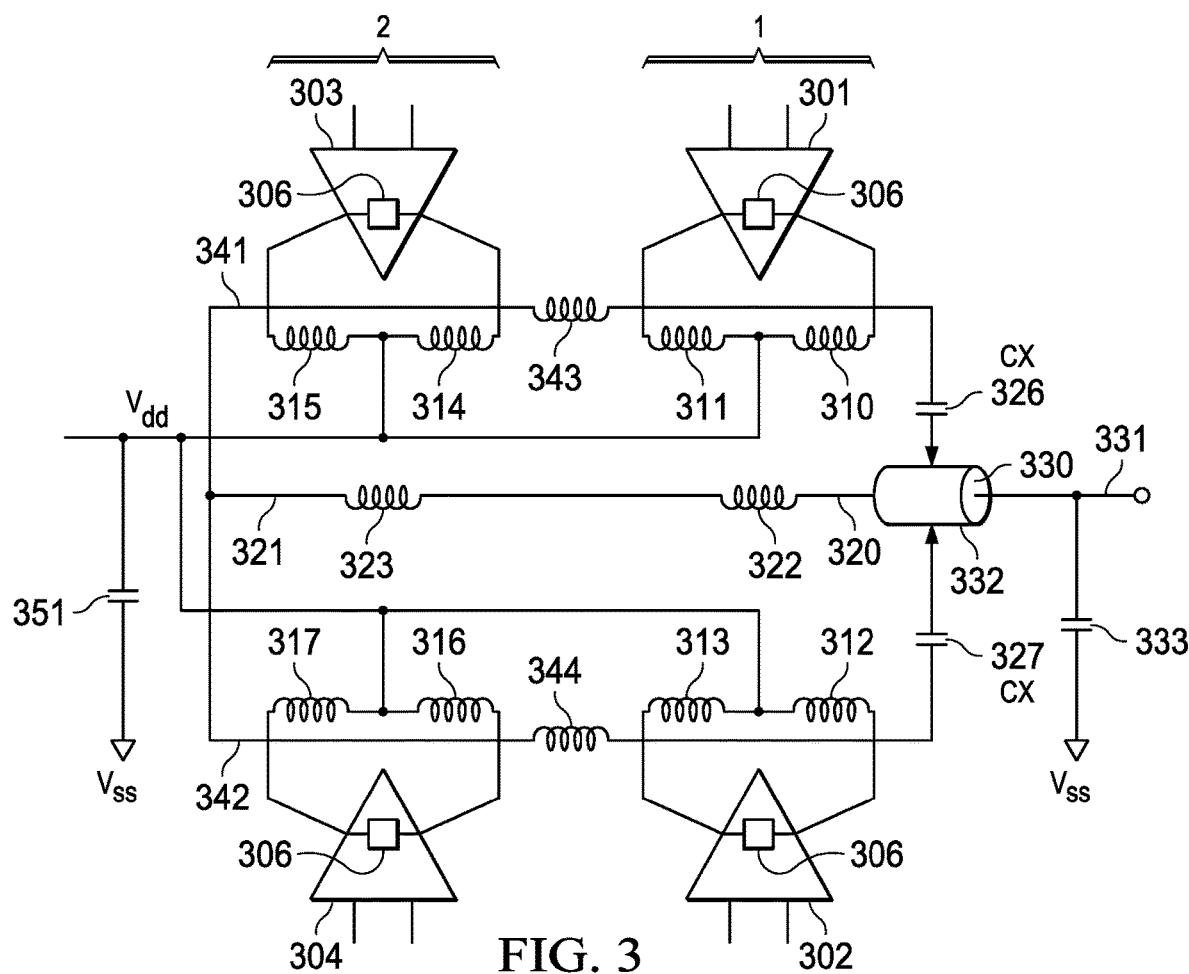
FIG. 3 is a schematic illustrating an inductive coupling circuit for combining outputs from multiple power amplifiers.

FIG. 3 is schematic illustrating an inductive coupling circuit for combining outputs from multiple power amplifiers (PA). In this example, there are four power amplifiers 301-304 whose outputs are combined using a serial-parallel inductive coupling structure. Each power amplifier 301-304 has a pair of output transistors in output stage 306 that operate in a differential configuration. The general operation of a differential power amplifier is well known and need not be described in detail herein.

In this example, the differential output transistors drive a differential inductive "winding" that forms the primary winding of an inductive coupler. For example, PA 301 drives differential windings 310, 311. The center tap of winding 310-311 is connected to Vdd in this example. In another embodiment, the center tap may be connected to Vss or to another voltage reference, depending on the configuration of the output stage 306. In either case, bypassing capacitors 351 provide an AC path between Vdd and Vss.

Likewise, output stage 306 of PA 302 drive differential windings 312, 313 which also act as a primary winding of the inductive coupler. As will be described in more detail below, windings 310, 311 and 312, 313 are both arranged to inductively couple to a secondary "winding" 322 in a parallel manner.

In a similar manner, output stage 306 of PA 303 drive differential windings 314, 315 and output stage 306 of PA 304 drive differential windings 316, 317 which are both arranged to inductively couple to a secondary "winding" 323 in a parallel manner.

Secondary winding 322 is connected in series with secondary winding 323 such that the outputs of all four PAs 301-304 are combined to form a single output at a higher power level.

One end of the serially connected secondary windings, indicated at 320, may be connected to a signal trace 331 of a transmission line 330 that conducts the combined output signal to an antenna or other circuitry on the IC. Transmission line 330 also has a reference plane 332 coupled to the other end 321 of the serially connected secondary windings. As will be explained in more detail below, an opposite end 321 of serially connected secondary windings may be coupled to the reference plane 332 of transmission line 330 via a resonant network.

The reference plane of transmission line 330 may be implemented differently in various embodiments. For example, in one embodiment the transmission line may be implemented as a microstrip signal line that is positioned above a flat conductive layer in which the flat conductive layer forms the reference plane. In another embodiment, the transmission line may be implemented as a coaxial cable in which the signal line is surrounded by a conduct layer that forms the reference plane. In another embodiment, the transmission line may be implemented as a stripline in which the signal line is placed between two ground reference planes. In another embodiment, the transmission line may be implemented as a coplanar waveguide, in which a ground reference trace is placed on each side of the signal line in a coplanar manner. In another embodiment, the transmission line may be a grounded coplanar wave in which the signal line and two coplanar reference signals on each side of the signal line are placed over a ground reference plane. In yet another embodiment, a transmission line may be implemented using other known or later developed techniques. In each embodiment, the opposite end of the serially connected secondary windings may be coupled to the various ground reference elements of the transmission line via a resonant network to improve impedance matching between the transmission line and the combined amplifiers.

As is known, a transmission line may be designed to have a "characteristic impedance" that is determined by several factors, including: spacing between the signal trace and the reference plane, the dielectric characteristics of the material the fills the space between the signal trace and the reference plane, etc. In this example, transmission line 330 may be designed to have a characteristic impedance of approximately 50 ohms.

As mentioned above, one end 321 of the serial connected secondary windings is coupled to the reference plane 332 of transmission line 330. In this example, two ground return signal lines 341, 342 are used to couple end 321 to reference plane 332. However, ground return lines 341, 342 may include parasitic inductance 343, 344 respectively that may affect the characteristic impedance of transmission line 330. As mentioned above, a resonant termination on the ground return path of the serially connected secondary windings may be used to compensate for the parasitic inductance of the ground return lines. Capacitive coupling 326, 327 may produce a reduction in inductance by resonating out the stray inductance 343, 344 in order to get to a required impedance to match output stage 306 of the PAs.

Figure 4:
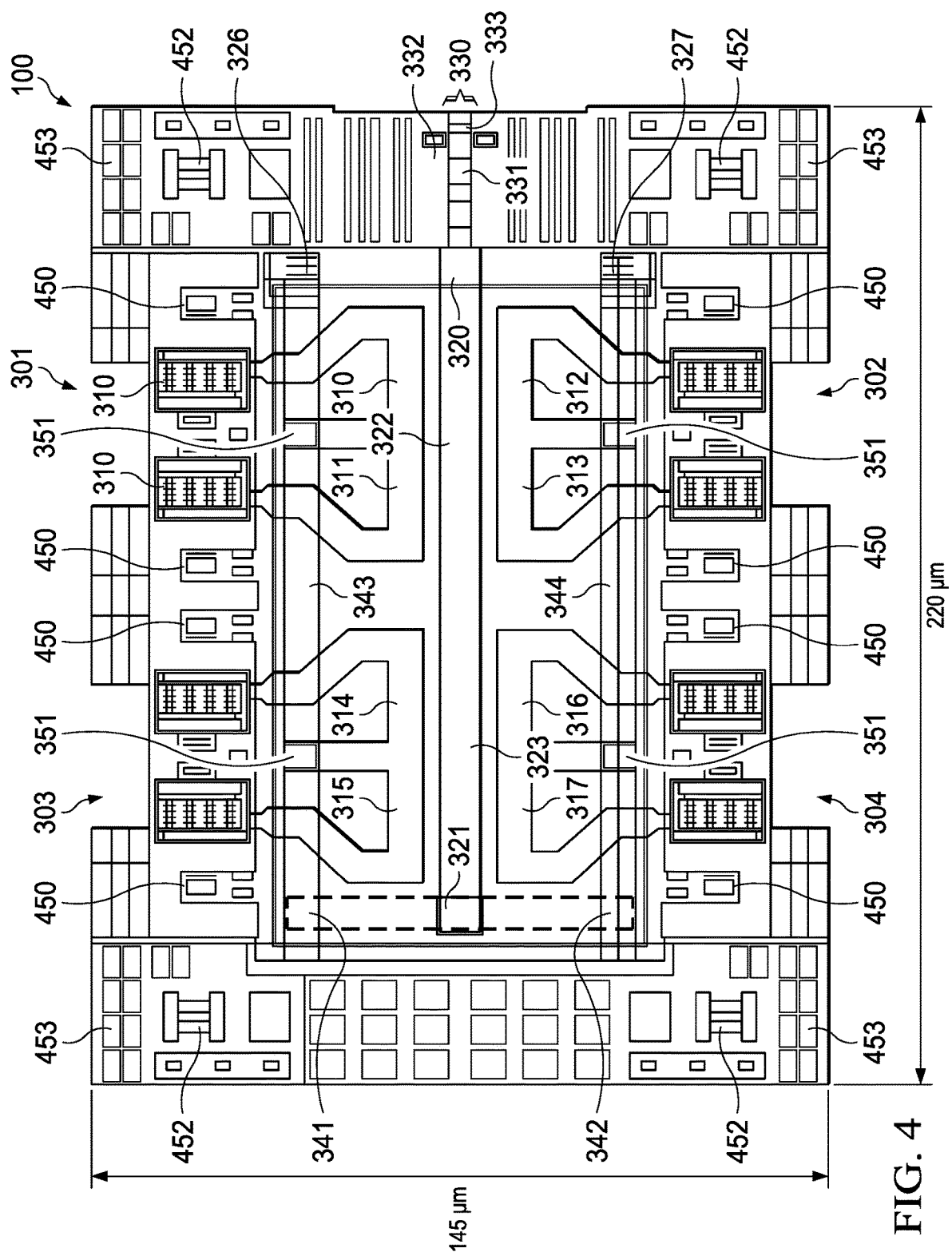
FIG. 4 is a floor plan of a portion of an integrated circuit illustrating an example layout of the inductive coupling circuit of FIG. 3.

FIG. 4 is a floor plan of a portion of integrated circuit 100 illustrating an example layout of the inductive coupling circuit of FIG. 3. In this example, power amps 301-304 are implemented using a standard 45 nm CMOS process and are designed to operate using a supply voltage of approximately 1.0 volts.

Primary windings 310-317 and secondary windings 322, 323 may be implemented by etching a thick metallic conductive layer that is formed on IC 100 using known processing techniques to form slab-style coupled line structures. As can be seen in FIG. 4, each of the "windings" 310-317 and 322, 323 are simple straight portions of conductive metal in which the secondary windings are located parallel to the primary windings so that inductance of each primary "winding" provides inductive coupling to the inductance of the corresponding secondary "winding".

In this example, the outputs of PAs 301 and 302 combine in parallel and thus the combined current is doubled. Similarly, PAs 303 and 304 combine in parallel and thereby increase the combined current. Each pair 301-302 and 303-304 are combined in series by series connected secondary windings 322, 323 and thereby the output voltage is approximately doubled. In this manner, the combiner allows both current and voltage of the combined output signal to be increased.

Ground return signal lines 341, 342 may also be implemented using thick metal to form the return lines. Since this is done in thick metal the Q of the structure is not degraded. Typically, a loss in the return path will be less than approximately 0.3-0.4 dB. Conversely, if the end 321 of the secondary windings was simply connected to a nearby ground plane mesh that serves the entire IC 100 and thereby to reference layer 332 adjacent transmission line 330, a loss of more than 1 dB may occur, for example. Thus, providing a dedicated resonant return path from the far end 321 of the series connected secondary windings to the reference plane of transmission line 330 improves combiner efficiency of the combined power amplifiers.

Note that return signal lines 341, 342 are spaced away from secondary winding 322, 323 and away from the primary windings 310-318 in order to avoid, or at least minimize, inductive coupling from the primary windings into the return signal lines. Such coupling may be detrimental to the combined output signal that is formed on the secondary windings.

Sizing of the return path coupling capacitors may be performed by simulating operation of the circuit. Various values of capacitance may be evaluated to determine which value of capacitance most effectively resonates with the distributed parasitic inductance 343, 344 of the return lines 341, 342. In this example, each return line coupling capacitor 326, 327 has a value of approximately 9 femtofarads (fF).

Peak detectors 450 detect peak signals at the drain of each output transistor in output stage 306 and thereby provide reliability monitoring. Drain node tuning capacitors are located adjacent each of the peak detectors 450. In this example, they each have a nominal value of approximately 30 fF. Output tuning Cap 333 has a nominal value of approximately 44 fF. Bias Cell 452 provides biasing for each peak detector. DECAP (decoupling capacitor) Cell 453 is used to provide an AC path from supply network to ground.

In this example, the entire combination of four output stages and coupling windings is implemented in an area of 145 um by 220 um using a standard 45 nm CMOS process.

Thus, in this example a four-way combiner secondary winding 322-323 provides a balanced to unbalanced conversion that allows differential PAs 301-304 to drive a single ended antenna. Impedance matching is also provided between the 50 ohm transmission line 330 and the output stage 306 of each of the PAs 301-304.

Figure 5:
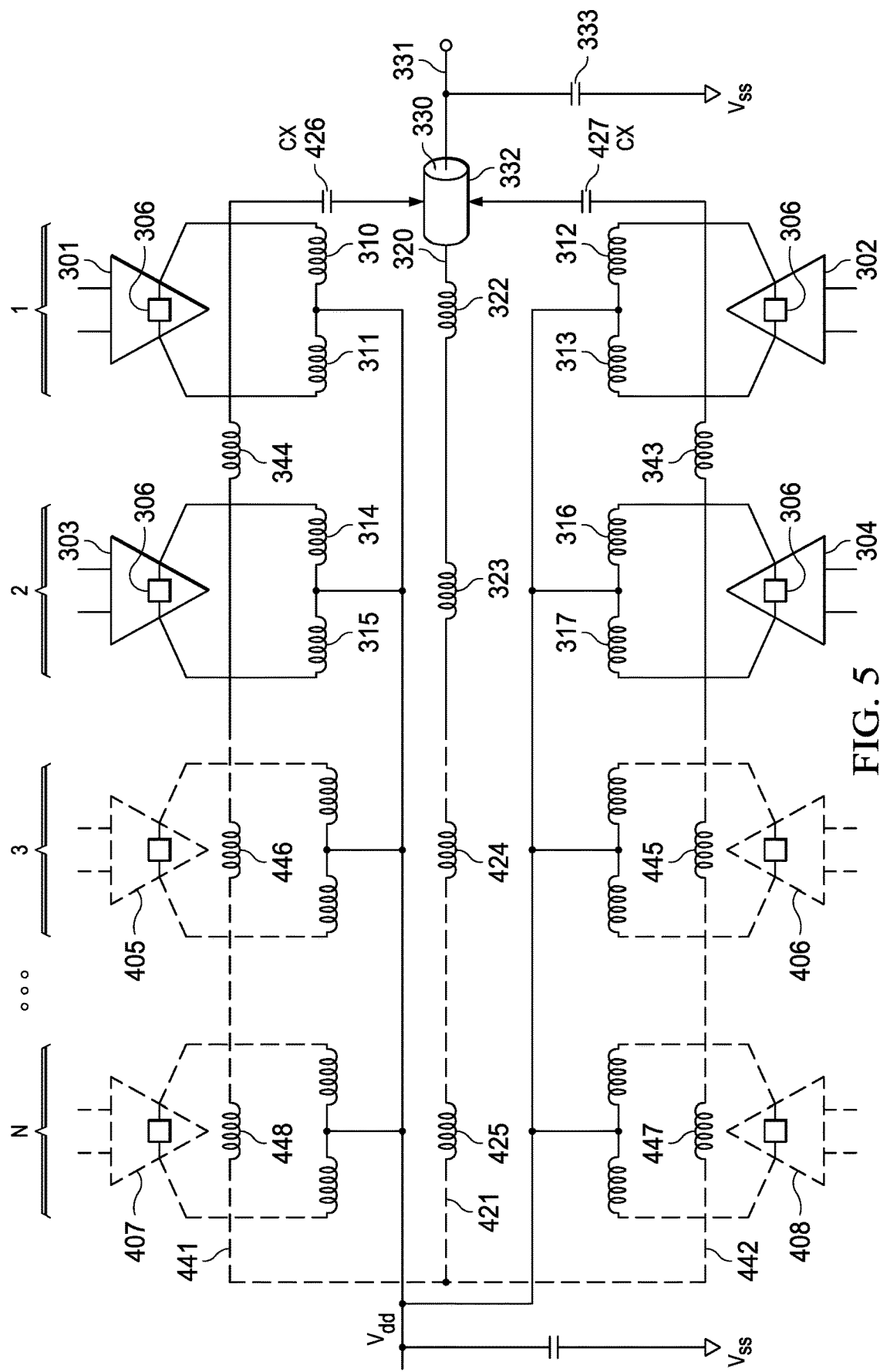
FIG. 5 is a schematic illustrating additional stages for the circuit of FIG. 3.

FIG. 5 is a schematic illustrating additional stages for the circuit of FIG. 3 to form an eight-way combiner. In this example, four additional PAs 405-408 are included by extending the serial connected secondary windings 322-323 to include 424-425. Similar to FIG. 3, the far end 421 of the serially connected windings is coupled to the reference plane 332 of transmission line 330 by resonant return paths 441, 442. As discussed above, the value of return path coupling capacitors 426, 427 may be determined based on the additional parasitic inductance 445-447. As discussed above, this may be done by simulating the operation of the eight-way combiner using various values for capacitor 426, 427. Various values of capacitance may be evaluated to determine which value of capacitance most effectively resonates with the distributed parasitic inductance 343, 344, and 445-448 of the return lines 441, 442 in order to compensate for the inductance provided by the return paths.

Thus, multiple stages of power amps may be combined to provide a power capability in excess of that possible using a single power amplifier with a given semiconductor technology. For each combination, dedicated return lines with coupling capacitors selected to compensate for parasitic capacitance of the return lines by resonance is provided. While eight power amps are illustrated in FIG. 5 and four where illustrated in FIG. 3, more or fewer stages may be combined using the principles disclosed herein.

Figure 6:
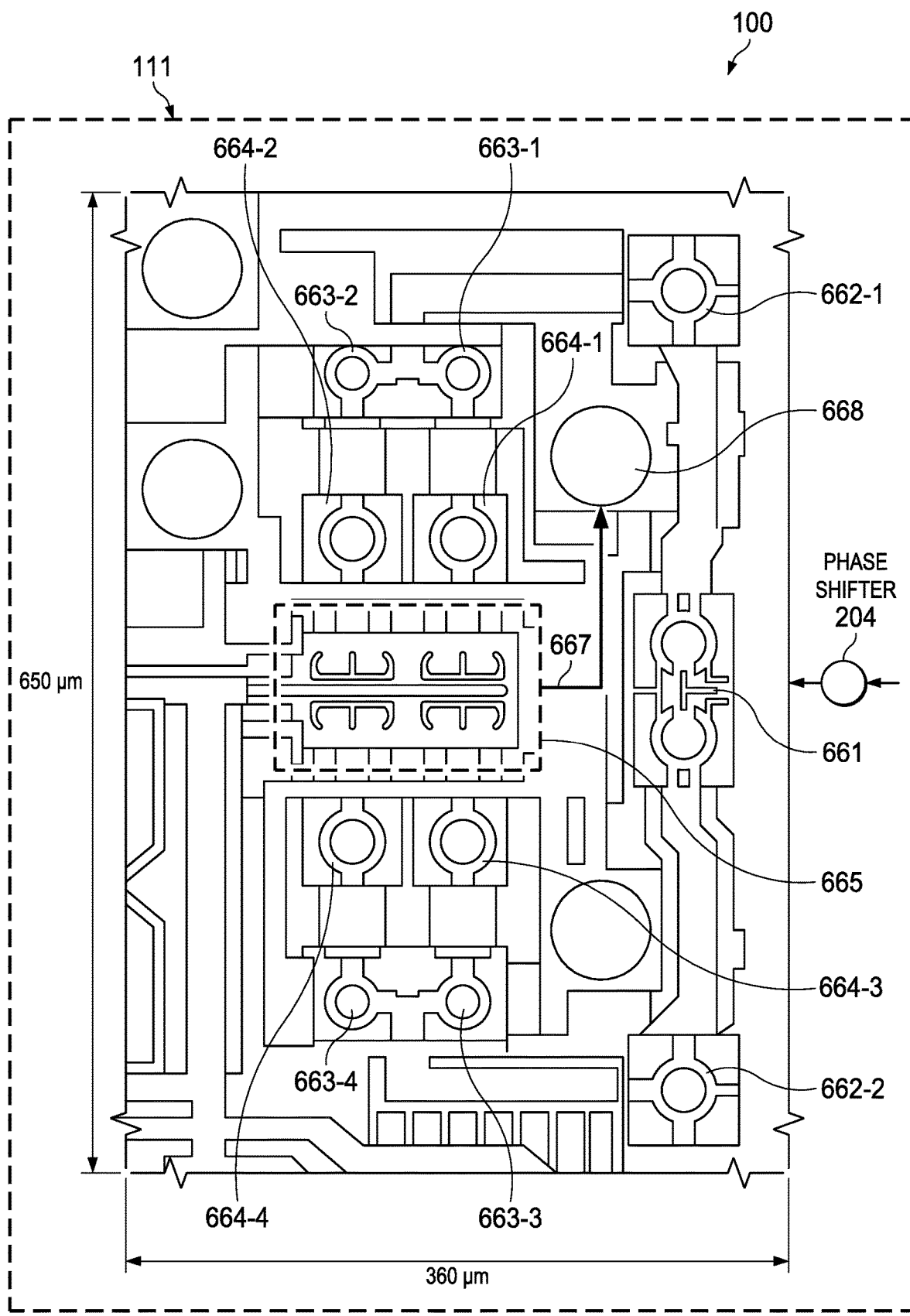
FIG. 6 is an illustration of a portion of the IC of FIG. 4, illustrating an example layout for four five-stage power amps in which their outputs are combined in accordance with the circuit of FIG. 3.

FIG. 6 is an illustration of a portion of the IC 100, illustrating an example layout for four five-stage power amps in which their outputs are combined in accordance with the circuit of FIG. 3. Transmit channel 111 is illustrated in this example, referring back to FIG. 2; however, transmit channels 112, 113 may be implemented in a similar manner in a single SoC. An output from phase shifter 204, referring back to FIG. 2, is provided to an input stage 661 that splits the input signal and sends one portion to second stage 662-1 and a second portion to second stage 662-2. An output from second stage 662-1 is then split with a portion being sent to third stage 663-1 and another portion being sent to third stage 663-2. An output from third stage 663-1 is provided to fourth stage 664-1. An output from fourth stage 664-1 is provided to fifth stage 665. Fifth stage 665 is the final output stage and is shown in more detail in FIG. 4. Similarly, an output from third stage 663-2 is provided to fourth stage 664-2. An output from fourth stage 664-2 is provided to fifth stage 665.

Similarly, an output from second stage 662-2 is then split with a portion being sent to third stage 663-3 and another portion being sent to third stage 663-4. An output from third stage 663-3 is provided to fourth stage 664-3. An output from fourth stage 664-3 is provided to fifth stage 665. Similarly, an output from third stage 663-4 is provided to fourth stage 664-4. An output from fourth stage 664-4 is provided to fifth stage 665.

Transmission line 330, referring back to FIG. 3, connects the combined output of fifth stage 665 to pad 668, as indicated generally by arrow 667. Transmission line 330 is equivalent to signal 206, referring back to FIG. 2, pad 668 is equivalent to pad 210 of FIG. 2, for example.

In this manner, four five-stage power amps may be combined and implemented in a space of approximately 360 um by 650 um using a standard 45 nmm CMOS process. Referring again to FIGS. 1 and 2, three such combined power amps may be implemented in three transmit channels 111-113 of a single SoC as part of radar system IC 100, for example.

In another example, a larger or smaller number of multistage power amps may be combined as disclosed herein. In another example, there may be only one or two, or more than three transmit channels implemented on a single IC, for example. In another embodiment, fewer or more amplification stages may be included within each power amplifier.

Figure 7:
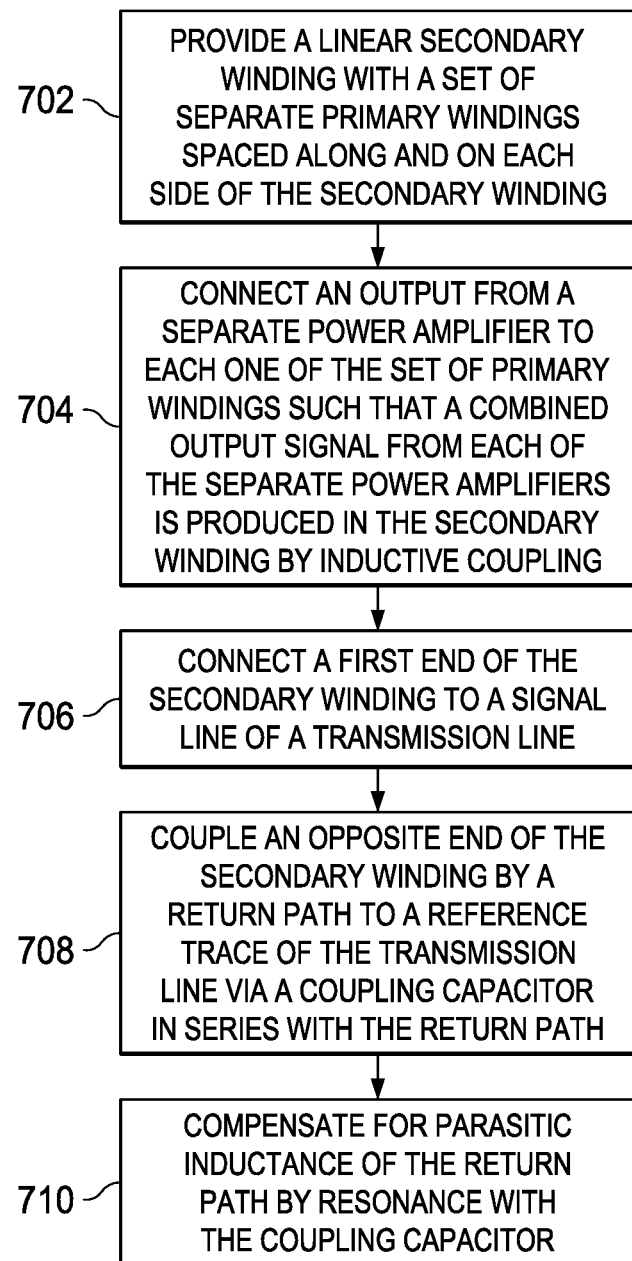
FIG. 7 is a flow diagram illustrating a method for combining outputs from a number of amplifiers.

FIG. 7 is a flow diagram illustrating a method for combining outputs from a number of power amplifiers. As discussed in more detail above, embodiments of the present disclosure include an improved topology that provides efficient and compact power combining at millimeter wave frequencies. The power combiner disclosed herein achieves a low loss multi-way power combiner by using slab-style coupled line structures as series and parallel coupled transformers, while providing a resonant return path for currents in the secondary of the transformer.

This solution disclosed herein provides 702 for a linear arrangement of series combined amplifier elements around the secondary winding. Parallel elements may be placed along the horizontal axis of symmetry of the secondary winding. A linear secondary winding is provided 702 with a set of separate primary windings spaced along and on each side of the secondary winding, as described in more detail above.

An output from a separate power amplifier is connected 704 to each one of the set of primary windings such that a combined output signal from each of the separate power amplifiers is produced in the secondary winding by inductive coupling.

A first end of the secondary winding is connected 706 to a signal line of a transmission line. As discussed in more detail above, the transmission line may be designed to have a specific characteristic impedance. The transmission line may conduct the combined output signal to an antenna, for example.

An opposite end of the secondary winding is coupled 708 by a return path to a reference trace of the transmission line via a coupling capacitor in series with the return path.

The topology disclosed herein uses a resonant termination on the secondary winding of the combiner that may form a single ended output. A value for the return path coupling capacitor is selected to have a value such that parasitic inductance of the return path is compensated 710 for by resonance with the coupling capacitor The layout of a series parallel combiner as disclosed herein allows a very compact and symmetric implementation of the driving amplifiers around the horizontal axis. Using a resonant effect, secondary inductance may be tailored to get an optimal impedance transformation from the driving amplifiers to the antenna. As is described above in more detail, RF current in the secondary is returned back to the transmission line ground via a well-defined return path.

As described above in more detail, return current from the secondary of a combining transformer as described herein may be routed back to a transmission line ground reference to capture ground loop inductance accurately. If the secondary is simply returned to a nearby ground plane, the inductance seen by the return current to the transmission line may be difficult or impossible to determine and therefore parasitic inductance compensation and accurate impedance matching may not be possible.

Other Embodiments

While the invention has been described with reference to illustrative embodiments, this description is not intended to be construed in a limiting sense. Various other embodiments of the invention will be apparent to persons skilled in the art upon reference to this description. For example, while combining outputs of four or eight power amplifiers are illustrated herein, outputs from a larger or smaller number of power amplifiers may be combined using the topology disclosed herein. For example, as few as two or three amplifiers may be combined in this manner. A maximum number of amplifiers may be determined by space available on an IC, for example.

While a 45 nm CMOS process is used for the examples illustrated herein, other semiconductor processes may be used to implement an integrated circuit with combined power amplifiers as disclosed herein.

While power amplifiers operating in the 76-81 GHz frequency range are described herein, power amplifiers designed to operate at higher or lower frequencies may be implemented in other embodiments.

While two return paths, such as paths 341, 342 with reference to FIGS. 2 and 3 have been described herein, a single path or more than two paths may be implemented in another embodiment.

While the term "ground return signal" is used herein, in another embodiment a reference level other than "ground" may be used, such as a negative or a positive voltage level, for example.

While double ended differential power amplifiers were discussed herein, in another embodiment the set of power amplifiers may be single ended, in which case the primary windings would not need to be center tapped.

In another embodiment, a variable capacitor may be used for the termination. In this case, a calibration process may be performed to set a capacitance value that optimizes power transfer from the combined amplifiers to the antenna.

In another embodiment, an arbitrary reactive termination may be used instead of a capacitor depending on the electrical length of the return path. In this case, simulation of the layout may be used to select a value for the reactive termination, for example.

In another embodiment, a single return path may be used instead of two parallel return paths, for example.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:
1. A circuit comprising:
a first power amplifier;
a second power amplifier;
a first primary winding coupled to the first power amplifier and to a node;
a second primary winding coupled to the second power amplifier and to the node;

a secondary winding structure inductively coupled to the first primary winding and to the second primary winding, the secondary winding structure having a first end and a second end;

a coaxial cable having a signal trace and a ground trace, wherein the signal trace is coupled to the first end of the secondary winding structure; and a return path for resonant termination on the secondary winding structure, the return path from the second end of the secondary winding structure coupled via a resonant network to the ground trace.

2. A circuit comprising:

a first power amplifier;

a second power amplifier;

a first primary winding coupled to the first power amplifier and to a node;

a second primary winding coupled to the second power amplifier and to the node;

a secondary winding structure inductively coupled to the first primary winding and to the second primary winding, the secondary winding structure having a first end and a second end, the secondary winding structure comprising:

a first secondary winding; and a second secondary winding coupled in series with the first secondary winding;

a transmission line having a signal trace and a ground trace, wherein the signal trace is coupled to the first end of the secondary winding structure; and a return path for resonant termination on the secondary winding structure, the return path from the second end of the secondary winding structure coupled via a resonant network to the ground trace.

3. The circuit of claim 2, further comprising:

a third power amplifier;

a fourth power amplifier;

a third primary winding coupled to the third power amplifier and to the node, the third primary winding inductively coupled to the secondary winding structure; and a fourth primary winding coupled to the fourth power amplifier and to the node, the fourth primary winding inductively coupled to the secondary winding structure.

4. The circuit of claim 2, wherein the first power amplifier comprises an output stage comprising a pair of output transistors coupled to the first primary winding, and wherein the first power amplifier is a differential power amplifier.

5. The circuit of claim 2, wherein the first primary winding has a center tap coupled to a voltage.

6. The circuit of claim 2, wherein the return path is spaced away from the secondary winding structure.

7. The circuit of claim 2, wherein the transmission line comprises a microstrip signal line positioned above a flat conductive layer.

8. The circuit of claim 2, wherein the transmission line comprises a coaxial cable.

9. The circuit of claim 2, wherein the transmission line comprises a stripline.

10. The circuit of claim 2, wherein the transmission line comprises a coplanar waveguide.

11. The circuit of claim 2, wherein the transmission line comprises a grounded coplanar waveguide.

12. The circuit of claim 2, wherein the transmission line has an impedance of approximately 50 ohms.

13. The circuit of claim 2, wherein the return path comprises a first return signal line and a second return signal line.

14. The circuit of claim 13, wherein the first return signal line comprises a first capacitor and the second return signal line comprises a second capacitor.

15. An integrated circuit comprising:

a first power amplifier;

a second power amplifier;

frequency synthesizer circuitry coupled to the first power amplifier and to the second power amplifier;

a first primary winding coupled to the first power amplifier;

a second primary winding coupled to the second power amplifier and to the first primary winding;

a secondary winding structure having a first end and a second end;

a transmission line coupled to the first end of the secondary winding structure; and a return path for resonant termination on the secondary winding structure, the return path from the second end of the secondary winding structure coupled via a resonant network to the transmission line, wherein the return path is spaced away from the secondary winding structure.

16. The integrated circuit of claim 15, wherein the secondary winding structure comprises a linear slab conductive trace, wherein the first primary winding has a linear slab conductive portion parallel to the linear slab conductive trace and the second primary winding has a linear slab conductive portion parallel to the linear slab conductive trace.

17. The integrated circuit of claim 15, wherein the first power amplifier is on a first side of the secondary winding structure, the second power amplifier is on a second side of the secondary winding structure, and the first power amplifier is adjacent to the second power amplifier.

18. The integrated circuit of claim 15, wherein the transmission line has a signal trace and a ground trace, wherein the transmission line is a grounded coplanar waveguide, wherein the ground trace comprises two coplanar ground traces and a ground plane, wherein the signal trace is between the two coplanar ground traces, and wherein the signal trace overlies the ground plane.

19. The integrated circuit of claim 15, further comprising:

receiver circuitry;

a digital signal processor (DSP) coupled to the receiver circuitry; and control logic coupled to the frequency synthesizer circuitry and to the DSP.

* * * * *